United States Patent
Stellman et al.

(10) Patent No.: US 10,321,615 B2
(45) Date of Patent: Jun. 11, 2019

(54) DISPLAY MODULE WITH INTEGRATED THERMAL MANAGEMENT STRUCTURE

(71) Applicant: Microsoft Technology Licensing, LLC, Redmond, WA (US)

(72) Inventors: Taylor Stellman, Seattle, WA (US); Andrew D. Delano, Woodinville, WA (US); Lincoln Ghioni, Redmond, WA (US); Kurt A. Jenkins, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 79 days.

(21) Appl. No.: 15/184,907

(22) Filed: Jun. 16, 2016

(65) Prior Publication Data
US 2017/0367214 A1 Dec. 21, 2017

(51) Int. Cl.
*H05K 7/20* (2006.01)
*G02F 1/1333* (2006.01)
*H01L 51/52* (2006.01)
*F21V 8/00* (2006.01)

(52) U.S. Cl.
CPC .......... *H05K 7/2099* (2013.01); *G02B 6/005* (2013.01); *G02B 6/0085* (2013.01); *G02B 6/0088* (2013.01); *G02F 1/133382* (2013.01); *H01L 51/529* (2013.01)

(58) Field of Classification Search
CPC .......... G02F 1/133382; H05K 7/20954; H05K 7/2099; G02B 6/0085
See application file for complete search history.

(56) References Cited

U.S. PATENT DOCUMENTS

| | | | |
|---|---|---|---|
| 6,493,440 B2 | 12/2002 | Gromatzky et al. | |
| 6,517,218 B2 | 2/2003 | Hochstein | |
| 7,369,407 B2 | 5/2008 | Kim | |
| 7,626,259 B2 | 12/2009 | Wehrly et al. | |
| 7,762,707 B2 | 7/2010 | Kim et al. | |
| 8,861,202 B2 | 10/2014 | Nassoiy | |
| 2007/0263352 A1 | 11/2007 | Jones et al. | |
| 2012/0327328 A1* | 12/2012 | Kim ................. | G02F 1/133308 349/59 |
| 2014/0118954 A1 | 5/2014 | Shi et al. | |

(Continued)

OTHER PUBLICATIONS

Kim, Sung Ki, "Analysis on Thermal Management Schemes of LED Backlight Units for Liquid Crystal Displays", In Proceedings of IEEE Transactions on Components, Packaging and Manufacturing Technology, vol. 2, Issue 11, pp. 1838-1846.

(Continued)

*Primary Examiner* — Jessica M Merlin
(74) *Attorney, Agent, or Firm* — Ray Quinney & Nebeker P.C.; Paul N. Taylor

(57) ABSTRACT

Described herein is a display module for an electronic device having a thermal management structure integrated on a backside of the display module. Also described herein are techniques for manufacturing a display module with an integrated thermal management structure. By integrating the thermal management structure on the backside of the display module, the display module itself becomes a passive thermal management solution for an electronic device. Accordingly, the thermal management structure described herein can be considered a part of the display component stack.

20 Claims, 10 Drawing Sheets

(56) References Cited

U.S. PATENT DOCUMENTS

| | | | |
|---|---|---|---|
| 2014/0139779 A1* | 5/2014 | Wu | G02F 1/133382 |
| | | | 349/58 |
| 2014/0168874 A1 | 6/2014 | MacDonald et al. | |
| 2014/0262160 A1 | 9/2014 | Vadakkanmaruveedu et al. | |
| 2014/0262161 A1 | 9/2014 | Weigand | |
| 2015/0253823 A1 | 9/2015 | Han | |
| 2016/0291397 A1* | 10/2016 | Pyo | G02F 1/133308 |
| 2017/0179554 A1* | 6/2017 | Pingree | H01M 10/6555 |

OTHER PUBLICATIONS

Luiten, IR. G. A. Wendy, "Thermal Management of Active LEDs in Consumer TV LED-LCD Display", In Proceedings of 30th Annual Semiconductor Thermal Measurement and Management Symposium, Mar. 9, 2014, pp. 146-152.

* cited by examiner (Section A-A)

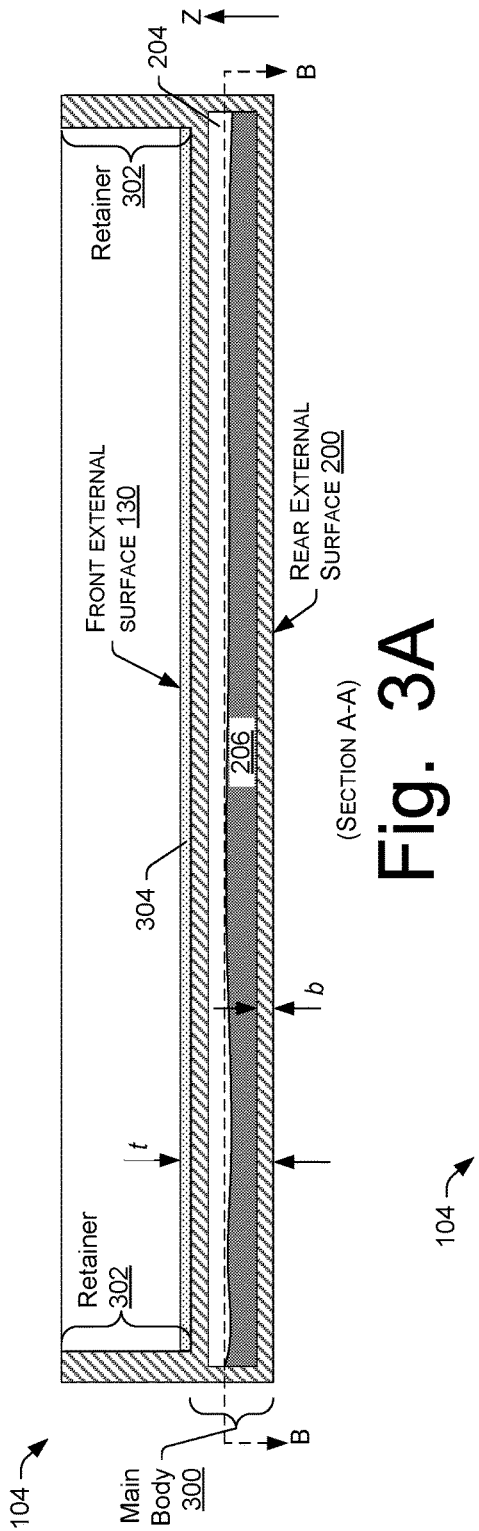
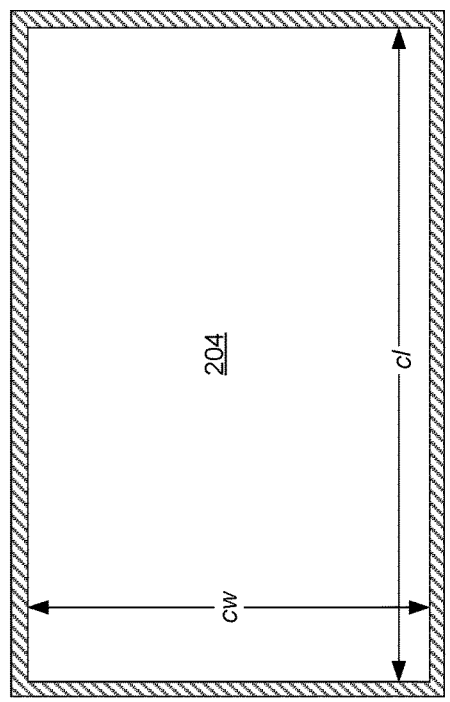
Fig. 3A (Section A-A)
Fig. 3B (Section B-B)

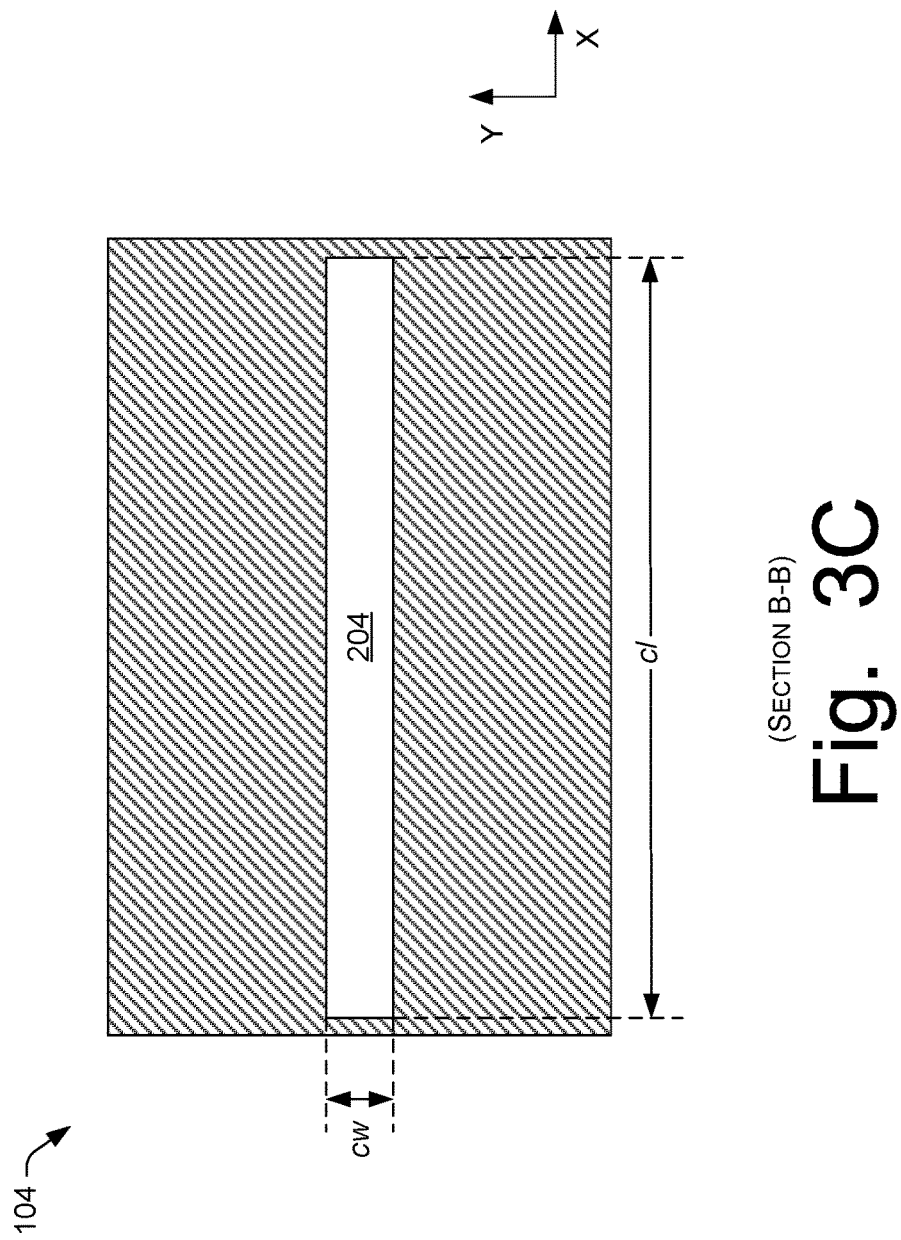

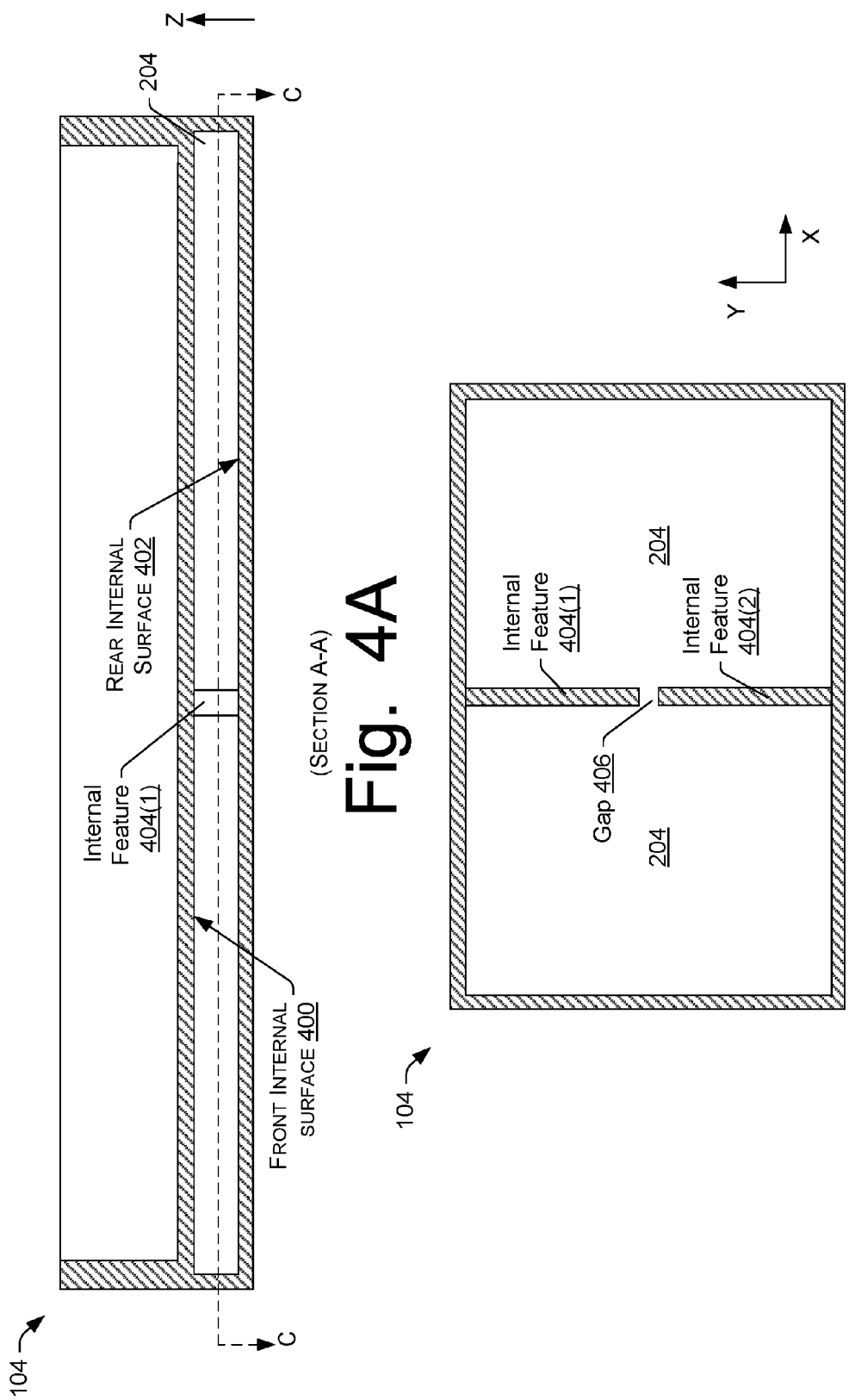

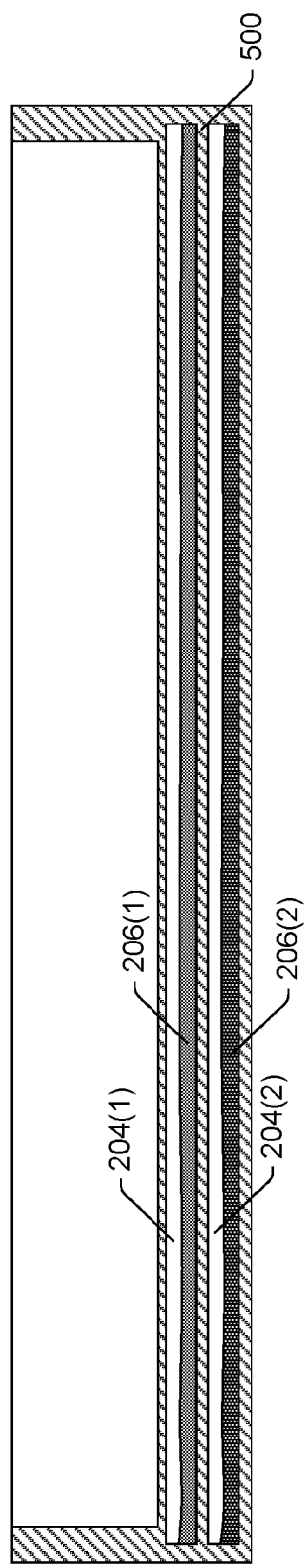

(SECTION E-E)

DISPLAY MODULE WITH INTEGRATED THERMAL MANAGEMENT STRUCTURE

BACKGROUND

It can be challenging to design an electronic device that packs a display module and various other components of the electronic device into a housing with a very thin profile without compromising the mechanical strength of the electronic device and without also creating a large thermal load on the electronic device. As design trends for electronic devices progress to thinner and thinner dimensions, these issues are exacerbated.

SUMMARY

Described herein is a display module for an electronic device having a thermal management structure integrated on a backside of the display module. Also described herein are techniques for manufacturing a display module with an integrated thermal management structure. By integrating the thermal management structure on the backside of the display module, the display module itself becomes a passive thermal management solution for an electronic device. Accordingly, the thermal management structure described herein can be considered a part of the display component stack.

In some configurations, an apparatus comprises one or more heat generating components (e.g., a central processing unit (CPU)) disposed behind a display module having a thermal management structure integrated on a backside of the display module. The display module can comprise a cover lens, a display layer (e.g., a liquid crystal display (LCD) panel, an organic light-emitting diode (OLED) layer, or the like) disposed behind the cover lens, and a thermal management structure integrated on a backside of the display module behind the display layer. The thermal management structure comprises at least one cavity containing a material configured to change phase during operation of the electronic device. In some configurations, the material within the cavity is configured to change phase within a temperature range of about 30 degrees Celsius (° C.) to about 110° C. The material, during the phase change, can change from solid-to-liquid or from liquid-to-gas. The one or more heat generating components can be coupled to a rear external surface of the thermal management structure to allow heat to be transferred from the heat generating component(s) to the thermal management structure, which causes the material in the cavity to change phase when the material reaches a particular temperature within the temperature range.

Integrating the thermal management structure on the backside of the display module allows the thermal management structure to be used as a multi-purpose component. That is, the thermal management component—as its name implies—can help dissipate heat from the heat sources within the electronic device housing (or from external heat sources, such as sunlight). In addition, the thermal management structure can serve one or more additional purposes. For example, the thermal management structure can serve as a structural member of the display module that adds mechanical strength to the display module, and in turn to the electronic device. Accordingly, the thermal management structure can be made to be more structurally supportive (i.e., stiffer) than existing metal frames that are used in today's backlight units, which are very thin and offer little structural support themselves. Added mechanical strength can improve the user's touch experience on the display because the electronic device is less prone to flexing, which can cause undesired visual artifacts to appear on the display screen during use of the device.

It is to be appreciated that, in at least some scenarios, the integration of the thermal management structure can come at little, or no, added thickness to the electronic device. For example, a traditional metal frame of a backlight unit that can be found in existing LCD modules (often about 0.3 millimeters (mm) thick) can be replaced with the thermal management structure described herein. Thus, the added thickness of the thermal management structure can be recovered by eliminating the metal frame of the backlight unit, thereby maintaining a "thin" device profile. In this scenario, the function previously performed by the metal frame of the backlight unit can be performed by the thermal management structure because the thermal management structure can act as a multi-use component of the display module. That is, the thermal management structure is configured to support the optical sheets of the backlight unit, add stiffness to the display module, and reduce the thermal load generated by the heat generating components of the electronic device, among other things.

In addition to eliminating the existing metal frame of the backlight unit, the integration of a thermal management structure to the display module can allow for eliminating other "layers" of existing display module designs whose singular purpose can be served instead by the thermal management structure. For example, a front external surface of the thermal management structure can be configured to reflect light so that the reflector layers in existing display modules can be eliminated in order to provide an even thinner device profile. Reflectors are found in multiple types of display technologies, including LCDs and OLED displays. Thus, in configurations where the front external surface of the thermal management structure is configured to reflect light, the device profile can be made even thinner as compared to configurations described herein that include the reflector layers. Alternatively, an existing reflector can remain in the display stack, and the thermal management structure having a reflective front external surface can increase the brightness of the display without adding any power to do so.

Because the thermal management structure is integrated on the backside of the display module, the large area of the display can be utilized for spreading heat across a substantial portion of the electronic device. This is because the large area of the display allows heat generated from localized heat sources to spread out over a much larger area than the area occupied by the heat generating component. This achieves better thermal management as compared to existing thermal management solutions. In turn, the electronic device can be driven at higher computational workloads (i.e., higher computing power) without creating a localized hotspot on the external surface of the device's housing (i.e., keeping the external surface temperature of the device housing at safe levels) and/or without overheating the electrical components, which improves the functionality of the electronic device.

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The same reference numbers in different figures indicates similar or identical items.

FIG. 3A illustrates a side, cross-sectional view of an example thermal management structure of FIG. 1 along section A-A.

FIG. 3B illustrates a front, cross-sectional view of the example thermal management structure shown in FIG. 3A as seen from section B-B.

FIG. 3C illustrates a front, cross-sectional view of the example thermal management structure shown in FIG. 3A as seen from section B-B according to another configuration.

FIG. 4A illustrates a side, cross-sectional view of an example thermal management structure of FIG. 1 along section A-A.

FIG. 4B illustrates a front, cross-sectional view of the example thermal management structure shown in FIG. 4A as seen from section C-C.

FIG. 5 illustrates a side, cross-sectional view of an example thermal management structure of FIG. 1 along section A-A.

DETAILED DESCRIPTION

Configurations of the present disclosure are directed to, among other things, a display module for an electronic device having a thermal management structure integrated on a backside of the display module. When the thermal management structure described herein is integrated in a display module of an electronic device, the electronic device can conserve resources with respect to power resources (e.g., battery), and/or other resources while better managing the thermal load created by heat generating components within the electronic device. The thermal management structure described herein can also improve the mechanical strength (i.e., stiffness) of the electronic device while maintaining a thin profile. Technical effects other than those mentioned herein can also be realized from an implementation of the technologies disclosed herein.

Figure 1:
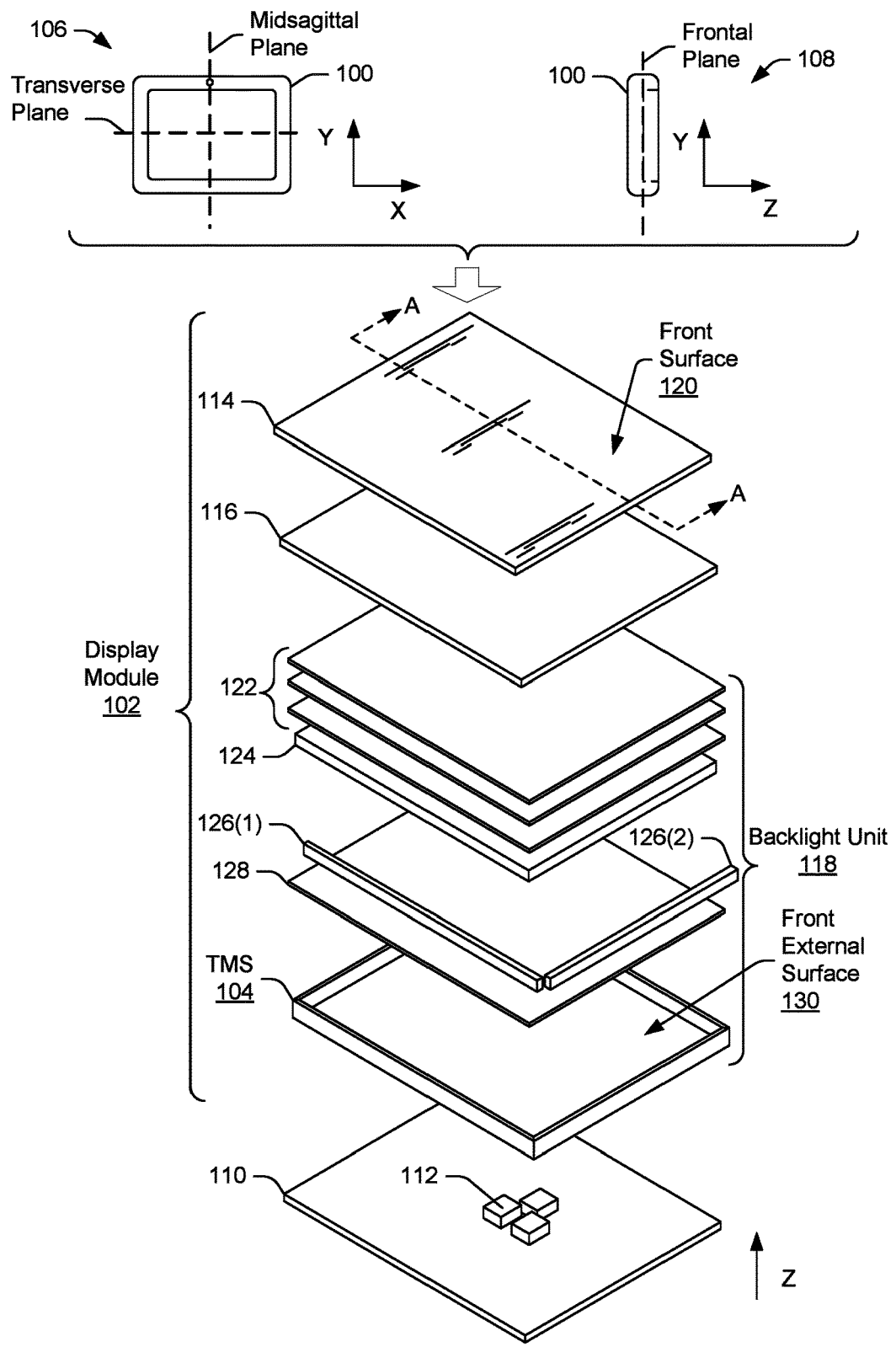
FIG. 1 illustrates an exploded perspective view of example components of an example electronic device including a display module having a thermal management structure integrated on a backside of the display module.

FIG. 1 illustrates an exploded perspective view of example components of an example electronic device 100 including a display module 102 having a thermal management structure 104 (abbreviated to "TMS 104" in FIG. 1) integrated on a backside of the display module 102. A front view 106 and a side view 108 of the electronic device 100 are also shown at the top of FIG. 1 for illustrating various planes of reference. For example, the front view 106 of the electronic device 100 shows an imaginary midsagittal plane that runs through the middle of the electronic device 100 and splits the electronic device 100 into right and left sides (in the context of a landscape orientation of the display). The front view 106 also shows an imaginary transverse plane that runs through the middle of the electronic device 100 and splits the electronic device 100 into superior (top/upper) and inferior (bottom/lower) parts. Finally, the side view 108 shows an imaginary frontal plane that runs through the middle of the electronic device 100 and splits the electronic device 100 into front and back parts. The front view 106 also shows a two-dimensional (2D) coordinate reference plane (e.g., an X-Y plane) that is parallel to the frontal plane, while the side view 108 shows a 2D coordinate reference plane (e.g., a Y-Z plane) that is parallel to the midsagittal plane.

The electronic device 100 can be implemented as any type of display device, including, without limitation, a personal computer, a laptop computer, a desktop computer, a portable digital assistant (PDA), a mobile phone, tablet computer, an electronic book (eBook) reader device, a television, a wall mounted display, a panel display, an automobile display, a navigation device display (e.g., global positioning system (GPS) device display), a point of sale terminal display, an automated teller machine (ATM) display, a wearable computing device having a display (e.g., a smart watch, electronic "smart" glasses, a fitness tracker, etc.), or any other electronic device that is configured to display digital images to a user on the display of the electronic device 100. FIG. 1 shows the electronic device 100 in the form of a tablet computer for illustrative purposes.

The components of the electronic device 100 shown in the exploded perspective view of FIG. 1 can include, without limitation, the display module 102 and a logic board 110 that is disposed behind the display module 102. The logic board can comprise any suitable substrate, such as a printed circuit board (PCB), configured to support electrical components including, without limitation, one or more central processing units (CPUs), one or more field programmable gate arrays (FPGAs), one or more graphics processing units (CPUs), one or more complex programmable logic devices (CPLDs), one or more application specific integrated circuits (ASICs), one or more system-on-chip (SoCs), and so on. Often these electrical components generate heat during operation of the electronic device 100 when power is supplied to the components mounted on the logic board 110. Hence, at least some of the components on the logic board 110 are referred to herein as "heat generating components 112." FIG. 1 depicts a few example heat generating components 112 that can be disposed on a front surface of the logic board 110.

The display module 102 of the electronic device 100 can include, (from top to bottom in FIG. 1), without limitation, a cover lens 114, a display layer 116, and a backlight unit 118. Although the display module 102 of FIG. 1 can be based on any suitable display technology, the display module 102 is shown to include the backlight unit 118, which is not found in some display technologies, such as OLED displays, and oftentimes, electrophoretic displays. Thus, the display module 102 of FIG. 1 can represent any suitable display technology known to a person having ordinary skill in the art that includes a backlight unit 118, such as an LCD display, which includes the backlight unit 118. In general, the display module 102 is configured to generate an image that is viewable to a user via the display screen of the electronic device 100.

The cover lens 114 can be configured to protect the internal components of the electronic device 100. The cover lens 114 is transparent to enable a viewing user of the electronic device 100 to view displayed images generated by the other components of the display module 102. The cover lens 114 can be made of a rigid, or semi-rigid, material that provides sufficient protection to the internal components from objects and environmental elements (e.g., water or moisture, dirt/dust, etc.). For example, the cover lens 114 can be made of glass, plastic, or some composite or combination thereof. In some cases, the cover lens 114 can be made of polycarbonate (PC), poly(methyl methacrylate (PMMA), or the like.

The cover lens 114 can be disposed in front of the display layer 116, and the cover lens 114 has a front surface 120 that, in general, faces the viewing user when the electronic device 100 is used as a viewing device (e.g., when the electronic device 100 is used to view images, documents, videos, etc.). Accordingly, the front surface 120 is oriented in the positive z-direction and is parallel to the frontal plane of the electronic device 100. It is to be appreciated that each of the components of the electronic device 100 shown in FIG. 1 can include surfaces that can be referenced in a similar manner. That is, each of the components shown in the exploded perspective view of the electronic device 100 can have a front surface oriented in the positive z-direction of FIG. 1 and a rear (or back) surface oriented in the negative z-direction of FIG. 1, where both front and rear surfaces are parallel to the frontal plane shown in FIG. 1.

The display layer 116 can be disposed behind the cover lens 114. In some configurations, the display layer 116 can comprise an LCD panel that is configured to turn pixels on/off and to change the pixel color of the image that is displayed by the display module 102. Depending on the type of display technology implemented in the display module 102, the display layer 116 can generally be configured to activate individual pixels in terms of either emitting light or allowing light to pass through the pixel area, and to generate a pixel color (e.g., red, green, or blue). Accordingly, the display layer 116 can comprise an array of liquid crystals that respond (e.g., twist or untwist) to supplied electric current, which, in turn, controls the amount of light that passes through the display layer 116. It is to be appreciated that, for touch display modules, one or more touch layers can be disposed in the display stack, such as between the cover lens 114 and the display layer 116. For example, a capacitive touch sensor, a resistive touch sensor, or the like, can be disposed between the cover lens 114 and the display layer 116 to enable touch sensing functionality for a touch screen display of the electronic device 100. It is also to be appreciated that optically clear adhesive (OCA) layers can be disposed between various layers/components shown in FIG. 1 in order to bond adjacent layers together in a manner that does not obstruct light passage through the layers of the display module 102. Any suitable OCA material can be used for the purpose of bonding adjacent layers of the display module 102 together.

The backlight unit 118 can be disposed behind the display layer (e.g., an LCD panel), and the backlight unit 118 can comprise multiple components that constitute the backlight unit 118. The backlight unit 118 is generally configured to project light that is emitted from a light source(s) of the backlight unit 118 in a direction towards the display layer 116 (i.e., in the positive z-direction and substantially perpendicular to the frontal plane, as shown in FIG. 1). The backlight unit 118 can include, (from top to bottom in FIG. 1), without limitation, a plurality of optical sheets 122 (or optical films), a light guide 124 (or light guide plate 124), one or more light sources 126, a reflector 128, and the thermal management structure 104.

The plurality of optical sheets 122 can be disposed behind the display layer 116 at the front of the backlight unit 118. The plurality of optical sheets 122 can be configured to control light that is emitted from the light source(s) 126 in a particular manner. The plurality of optical sheets 122 can be arranged in a stack and can comprise any suitable number of optical sheets. Although FIG. 1 shows three optical sheets 122, this number is illustrated merely for exemplary purposes and is not limiting on the number of optical sheets 122 that can be included in the backlight unit 118. The optical sheets 122 can include a diffuser sheet, a polarizer sheet, a filter sheet, and/or any other suitable type of optical sheet 122 for a display backlight unit 118.

The light guide 124 can be disposed behind the optical sheets 122 and is configured to distribute or diffuse the light emitted from the light source(s) 126 behind the display layer 116. The light guide 124 can be made of a plastic material and can include a series of unevenly distributed bumps that diffuse light in a particular manner e.g., generally an even distribution of light across an area of the light guide 124)

The light source(s) 126 can be disposed on substantially the same plane (parallel to the frontal plane) as the light guide 124. This coplanar arrangement of the light sour s) 126 and the light guide 124 can represent an edge-light type backlight unit 118. In some configurations, the light source(s) 126 can comprise a series of light emitting diodes (LEDs) arranged in a row and oriented such that the light emitted from the light source(s) 126 is directed toward the light guide 124. FIG. 1 shows a row of light sources 126(1) arranged along an axis that is parallel to the x-axis, and another row of light sources 126(2) arranged along an axis that is parallel to the y-axis. It is to be appreciated, however, that the display module 102 can comprise a single row of light sources 126(1) or 126(2), or multiple rows, as shown in FIG. 1, which can include rows of light sources 126 at two or more side edges of the light guide 124 (including two opposing side edges of the light guide 124). Furthermore, the light sources 126 can comprise an array of light sources 126 distributed over a substrate on a 2D plane that is parallel to the frontal plane of FIG. 1, and the substrate of light sources 126 can be disposed behind the optical sheets 122. In this scenario, the backlight unit 118 can represent a direct-light type backlight unit 118 where the light guide 124 can be omitted from the backlight unit 118.

The reflector 128 can be disposed behind the light guide 124 and the light source(s) 126, and is configured to reflect light toward the display layer 116 (i.e., in the positive z-direction of FIG. 1). For example, the light source(s) 126 can emit some light in the negative z-direction, which would be wasted light if it were not reflected in the positive z-direction. Thus, the reflector 128 can optimize the brightness of the display module 102.

The thermal management structure 104 can be disposed behind the reflector 128 and, in some configurations, the thermal management structure 104 can be in contact with the reflector 128. In some configurations, the reflector 128 can be omitted from the display module 102, in which case the thermal management structure 104 can be in contact with the light guide 124, or, if the backlight unit 118 is a direct-light type backlight unit 118, a substrate on which the light sources 126 are mounted. In any case, the thermal management structure 104 can be described as being disposed behind any one of the components situated in front of the thermal management structure 104 (i.e., situated a distance from the thermal management structure 104 in the positive z-direction). In this manner, the thermal management structure 104 is sometimes described herein as being disposed behind the display layer 116, even though components of the backlight unit 118 can be disposed in between the display layer 116 and the thermal management structure 104, in some configurations.

In this manner, the thermal management structure 104 is integrated on a backside of the display module 102. FIG. 1 shows a configuration where the thermal management structure 104 is a rear component of the backlight unit 118 that serves the additional purpose of a frame that supports the remaining components of the backlight unit 118 and holds them in place on a front external surface 130 of the thermal management structure 104. For example, the thermal management structure 104 can be in the shape of a five-sided box with an open front so that the remaining components of the backlight unit 118 can be disposed within a recess on the front side of the thermal management structure 104. For example, the reflector 128, the light guide 124, and the optical sheets 122 can be stacked within an open recess defined on the front of the thermal management structure 104 when the layers of the backlight unit 118 are assembled together. Said another way, the thermal management structure 104 can comprise one or more retainers disposed at a perimeter of the front external surface 130, the retainers protruding in a direction generally perpendicular to the front external surface 130 (i.e., in the positive z-direction). The retainers can be configured to retain the reflector 128, the light guide 124, the light source(s) 126, and/or the optical sheets 122 on the front external surface 130 of the thermal management structure 104. Thus, the thermal management structure 104 serves a structural purpose in supporting remaining components of the backlight unit 118 and creating rigidity or stiffness for the display module 102 itself.

It is to be appreciated that the thermal management structure 104 can wholly replace the metal frame that is typically found in a traditional backlight unit, where the traditional metal frame is much less structurally supportive than the thermal management structure 104. For example, today's overly-thin metal frames that are used in backlight units merely hold the optical sheets of the backlight unit like a paper tray holds paper, but they otherwise provide little structural support and serve no other useful purpose, yet they come at the cost of added thickness. These factors that compromise the mechanical strength of the electronic device detract from the user's touch experience on the display. They also detract from the perceived quality of the electronic device because thin and weak displays distort easily. Thus, by eliminating the traditional metal frame and replacing it with the thermal management structure 104 described herein, a thin device profile (as measured as a distance in the z-direction) can be maintained while providing additional technical improvements to the display module 102.

In some configurations, the front external surface 130 of the thermal management structure 104 can be configured to reflect light. In order to reflect light, the front external surface 130 can be made of a metal material that is polished during manufacturing to make the front external surface 130 "light reflective." Alternatively, a light-reflective film, or a light-reflective coating (e.g., silver plating) can be applied on the front external surface 130 of the thermal management structure 104. In any case, a reflective front external surface 130 can allow for the elimination of the reflector 128 from the backlight unit 118, and as such, the reflector 128 is a purely optional component of the display module 102. When the thermal management structure 104 can reflect light off of its front external surface 130, the omission of the reflector 128 can further reduce the thickness of the device profile to create an even thinner electronic device 100 (as measured as a distance in the z-direction).

The thermal management structure 104—as its name implies—can be configured to dissipate, or otherwise spread, heat in order to prevent the temperature inside the electronic device 100 from increasing, reduce the rate at which temperature increases inside the electronic device 100, or otherwise reduce the temperature inside the electronic device 100. Due to the density at which the components (many of which generate heat during operation) are often packed within a thin housing of the electronic device 100, the extent to which the electronic device 100 can use available computing power is limited by the temperature at which the electrical components within the device 100 operate. This is because these electrical components can overheat and become inoperable at a particular temperature threshold. This is especially true with today's tablet computing devices that pack all of the components into a single housing that is very thin. As electronic devices become thinner, cooling air paths become more obstructed, which creates an additional burden for existing thermal management systems. Fans are reaching their useful limit for controlling rising temperatures within electronic devices at today's thin standards. Moreover, displays themselves are also producing more heat due to the additional backlighting that is being supplied to meet the increasing demand for brightness. Thus, proper heat management allows for better utilization of the available computing power of the electronic device 100.

In addition, if the external surface temperature of the device's 100 housing increases above a particular threshold, the housing can become unsafe to touch with a bare hand or finger. A localized "hot spot" where the touch temperature rises to unsafe levels can be created at a location on the external housing where a heat-generating source is disposed. Accordingly, the thermal management structure's 104 ability to spread heat can mitigate the occurrence of these localized "hot spots," thereby making the electronic device 100 safe to touch during operation. Thus, the thermal management structure 104 represents a passive heat management solution that is configured to manage the thermal load from various heat generating sources in the electronic device 100, such as the heat generating components 112 mounted on the logic board 110, and/or the light source(s) 126 of the backlight unit 118. Thus, the proximity of the thermal management structure 104 to the heat generating components 112, and to the light sources 126, makes the thermal management structure 104 more effective in dissipating the heat generated from those heat sources.

In some configurations, one or more of the heat generating components 112 can be coupled to a rear external surface of the thermal management structure 104. In some configurations, the coupling of the heat generating component(s) 112 to the rear external surface of the thermal management structure 104 can be accomplished using a thermal interface material a heat conductive paste or pad) that bonds the heat generating component(s) 112 to the rear external surface of the thermal management structure 104 and improves the efficiency of heat transfer from the heat generating component(s) 112 to the thermal management structure 104.

As will be described in more detail below, the thermal management structure's 104 heat dissipating characteristics can be enabled by a cavity defined within the thermal management structure 104, the cavity containing a material configured to change phase during operation of the electronic device. This material (sometimes referred to herein as a "phase change material") can change phase from a solid to a liquid, or from a liquid to a gas, at a particular temperature within the temperature range of about 30° C. to about 110° C.

Figure 2:
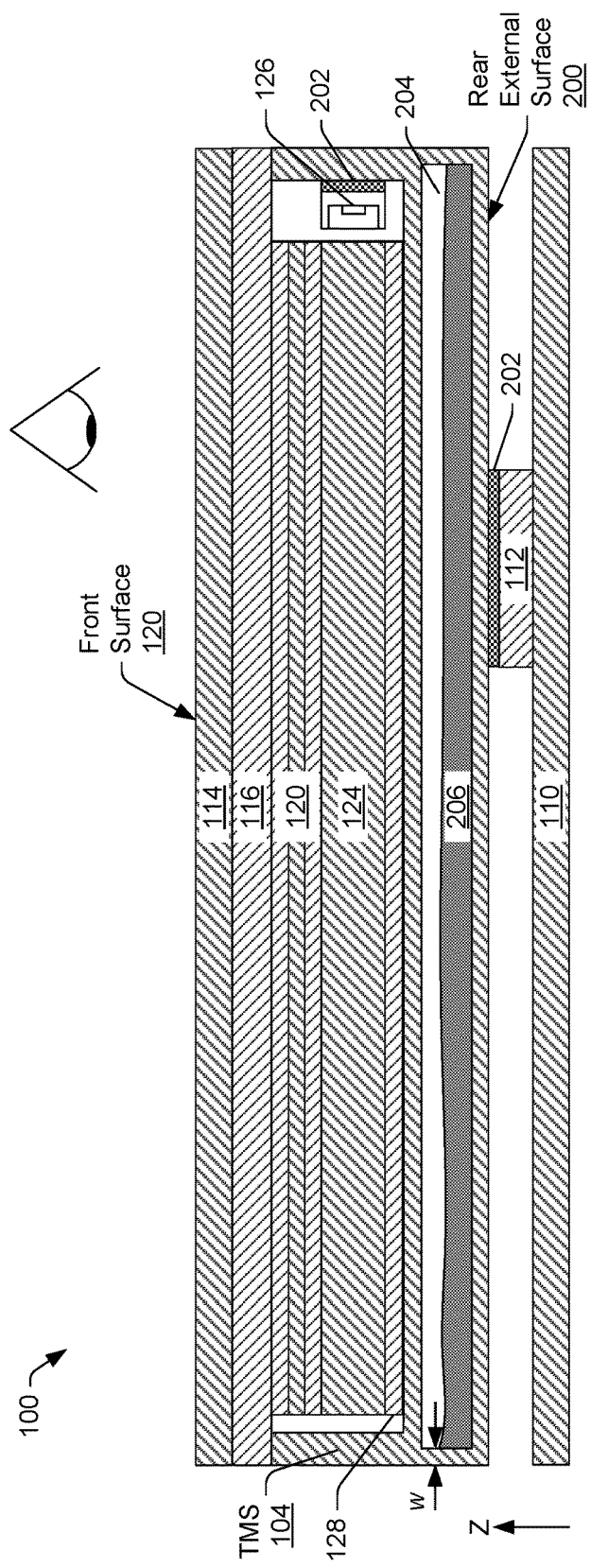
FIG. 2 illustrates a side, cross-sectional view of the example electronic device of FIG. 1 along section A-A.

FIG. 2 illustrates a side, cross-sectional view of the example electronic device 100 of FIG. 1 along section A-A. Many of the same components introduced in FIG. 1 are shown in FIG. 2. FIG. 2 shows the structure of the thermal management structure 104 in greater detail, and also illustrates an example of how the components the electronic device 100 can be coupled together after assembly. For example, FIG. 2 shows that one or more heat generating components 112 can be mounted on the logic board 110 and coupled to a rear external surface 200 of the thermal management structure 104 using a thermal interface material (TIM) 202, as mentioned with reference to FIG. 1. The thermal interface material 202 can comprise a thermally conductive pad, paste, glue, or grease that is configured to reduce the thermal impedance between the heat generating component(s) 112 and the thermal management structure 104, allowing for a more efficient transfer of heat than an air gap would allow for. In some configurations, the light source(s) 126, such as an LED package, can be coupled to the thermal management structure 104 using the same, or a different, thermal interface material 202 as is used to couple the heat generating component(s) 112 to the thermal management structure 104. In this manner, the heat generated from the light source(s) 126 can also be more efficiently transferred to the thermal management structure 104.

The thermal management structure 104 is shown as being integrated on a backside of the display module 102 by virtue of the thermal management structure 104 being a rear-most component of the backlight unit 118. The front external surface 130 of the thermal management structure 104 is shown as being in contact with the reflector 128. In configurations where the reflector 128 is omitted, the front external surface 130 of the thermal management structure 104 can be in contact with the light guide 124 (or in contact with a substrate supporting an array of light sources 126 in a direct-light type backlight unit 118). Furthermore, retainers that protrude in a direction generally perpendicular from the front external surface 130 of the thermal management structure 104 can house the remaining components of the backlight unit 118, and can be coupled to the rear surface of the display layer 116.

The thermal management structure 104 is shown in FIG. 2 as comprising a cavity 204 that contains a phase change material 206 (i.e., a material configured to change phase during operation of the electronic device). In some configurations, the phase change material 206 is configured to change phase within a temperature range of about 30° C. to about 110° C. In some configurations, the temperature range in which the phase change material 206 changes phase can be from about 10° C. to about 130° C. In some configurations, the temperature at which the phase change material 206 begins to change phase can be at least about 10° C., at least about 15° C., at least about 20° C., at least about 25° C., at least about 30° C., at least about 35° C., or at least about 40° C. In some configurations, the temperature at which the phase change material 206 begins to change phase can be no greater than about 130° C., no greater than about 125° C., no greater than about 120° C., no greater than about 115° C., no greater than about 110° C., no greater than about 105° C., or no greater than about 100° C.

In some configurations, the phase change material 206 changes phase from a liquid to a gas at a temperature within a suitable temperature range, as described herein. In this scenario, the cavity 204 of the thermal management structure 104 can represent a vapor chamber, and the phase change material 206 can be considered to be the "working fluid" of the vapor chamber. In this configuration, a first portion of the phase change material 206 is in a liquid state and a second portion of the phase change material 206 is in a gaseous state. As the electronic device 100 is operated and heat sources (e.g., the heat generating component(s) 112 on the logic board 110, the light source(s) 126, etc.) within (or external to) the electronic device 100 generate heat, the generated heat is transferred through the heat conductive material of the thermal management structure 104 where the temperature of the phase change material 206 (in this case, a working fluid/liquid) increases. When the liquid portion of the phase change material 206 reaches a particular temperature, the liquid portion starts to change from a liquid form to a gaseous form. Gas expands and moves to cold regions inside the cavity 204 where the gas condenses into a liquid, and the condensed liquid then moves back to the hotter regions to create an internal cycle that continually dissipates heat by virtue of the cyclic vaporizing and condensing of the liquid and gas phases, respectively. In this configuration, the phase change material 206 can comprise any suitable working fluid, including, without limitation water (e.g., deionized water), ammonia, ethanol, methanol, acetone, mercury, and/or similar materials with a phase transition temperature within a suitable temperature range, as described herein.

The material of the thermal management structure 104 is heat conductive material, and is to be compatible with the phase change material 206 in the scenario where the phase change material 206 changes from a liquid to a gas during the phase change. "Compatibility," in this context means two materials that do not result in the development of corrosion, oxidation, or the like, which can affect the purity of the phase change material 206 and cause the internal cooling cycle to stop working. Depending on the working fluid chosen for the phase change material 206, the heat conductive material of the thermal management structure 104 can include, without limitation, a metal, such as copper, aluminum, stainless steel, titanium, or the like. Copper is known to be compatible with water as the working fluid, and copper has a high thermal conductivity relative to other suitable metals that can be used for the heat conductive material of the thermal management structure 104. Aluminum is known to be compatible with ammonia as the working fluid. However, any suitable combination of compatible materials for the thermal management structure 104 and the phase change material 206 are contemplated herein. A thermal management structure 104 made of copper and including a cavity 204 containing water as a working fluid is known to have a thermal conductivity on the order of 3000 watts per meter kelvin. Integrating such a thermal management structure 104 on a backside of the display module 102 to leverage the large area of the display can provide an efficient and effective heat management solution for the electronic device 100.

In some configurations, the phase change material 206 changes phase from a solid to a liquid at a temperature within a suitable temperature range, as described herein. In this scenario, the thermal management structure 104 acts as a "thermal battery." In the thermal battery context, heat is transferred to the thermal management structure 104, causing the temperature of the phase change material 206 to rise to its melting point and change from solid form into a liquid form. Once all of the solid changes to a liquid, the efficacy of the thermal management structure 104 (in terms of cooling the electronic device 100) declines. This is due to the fact that the temperature of the phase change material 206 stays constant during the phase change from solid to liquid until enough energy is put into the system to overcome the latent heat of the system, and then the temperature of the phase change material 206 (now in liquid form) begins to rise again as more heat is generated. In this scenario, the electronic device 100 can operate at a high workload in teats of processing power, and the temperature inside the electronic device 100 (during the phase change of the phase change material 206) will stay substantially constant.

If the workload of the electronic device 100 decreases (or ceases) before all of the solid changes to a liquid, the temperature may decrease, causing the liquid to return to a solid state, and the thermal management structure 104 can thereafter be re-used as a passive heat management solution when the workload increases at a subsequent point in time. This "thermal battery" configuration—where the phase change material 206 changes from a solid to a liquid at a temperature within a suitable temperature range, as described herein—is ideal for dissipating heat during intermittent peak usage of the electronic device 100. In this configuration, the phase change material 206 can comprise any suitable solid-to-liquid phase change material, including, without limitation wax, naphthalene, and/or any similar material with a melting point within a suitable temperature range, as described herein. The vapor chamber configuration—where the phase change material 206 changes from a liquid to a gas at a temperature within a suitable temperature range, as described herein—is better (as compared to the thermal battery configuration) for dissipating heat during sustained high workloads of the electronic device 100.

The cavity 204 inside the thermal management structure 104 is sealed and, in some configurations, a vacuum is created inside the cavity 204. Furthermore, the cavity 204 can be any size depending on the configuration. FIG. 2 shows the cavity 204 spanning substantially the entire length (or width) of the thermal management structure 104 (and the display module 102) in the x-direction. The cavity 204 can also span substantially the entire width (or length) of the display in the y-direction. Thus, the area of the cavity 204 can be substantially equal to the area of the display (in a plane that is parallel to the frontal plane) to take advantage of the large area of the display, which can be used for spreading heat across the entire electronic device 100. Said another way, a viewable portion of the display module 102 can be defined by an area of the display layer 116 (e.g., the area of an LCD panel) as defined in a plane parallel to the x-y plane, or to the frontal plane shown in FIG. 1. The area of the cavity 204, as defined by its x-dimension multiplied by its y-dimension, can be substantially equal to the area of the display layer 116. "Substantially equal" in this context means a difference between the area of the display layer 116 and the area of the cavity 204 can be due to the wall thickness, w, of the side walls that define part of the cavity 204, as shown in FIG. 2. In some configurations, the wall thickness, w, can be on the order of 0.3 mm. Thus, if the area of the cavity 204 is calculated by a cavity length on the x-axis multiplied by a cavity width on the y-axis, then the area of the cavity 204 can be considered to be "substantially equal" to the area of the display layer 116 (as defined in respective planes that are parallel to the frontal plane) if the area of the cavity 204 is less than the area of the display layer 116 by about 0.6*cavity width+0.6*cavity length–0.36 (assuming a uniform wall thickness, w, around all four sides of a rectangular cavity 204). Although the cavity 204 can span substantially the entire display area, as described herein, the size of the cavity 204 is not so limited. Rather, the cavity 204 can be of any suitable size, as described in more detail below. Furthermore, the thermal management structure 104 can comprise more than one cavity 204, in some configurations.

It is to be appreciated that, though the heat sources within the electronic device 100 that generate the most heat (e.g., one or more CPUs) may be on the logic board 110, the thermal management structure 104 can provide the added benefit of dissipating the heat generated by the light source(s) 126 (e.g., LEDs) of the display's backlight unit 118 due at least in part to the proximity of the thermal management structure 104 to the light source(s) 126 within the backlight unit 118, and/or due to the thermal interface material 202 that can be used to couple the light source(s) 126 (e.g., LED packages) to the thermal management structure 104. In configurations where the light sources 126 comprise a plurality of LEDs, keeping the LEDs at a cooler temperature allows for more light to be extracted from the LEDs without a commensurate increase in power supplied thereto. This can lead to brighter displays using the same number of LEDs as are found in conventional backlight units 118. Alternatively, a reduced number of LEDs can be used to achieve the same brightness of conventional displays. For example, the existence of the thermal management structure 104 acting as a passive heat management solution can allow for a reduction in the number of LEDs, which can save a significant amount of cost in terms of the bill of materials of the electronic device 100. Alternatively, the LEDs can be driven at a lower power to achieve the same brightness of conventional displays, which can improve battery life in configurations where the electronic device 100 is a mobile device. Moreover, the lifetime of the LED packages can be extended if the LEDs are operated at cooler temperatures because the LED packages will not degrade as quickly as they would at hotter temperatures. All of these added benefits provide for technical improvements to the display module 102 due to the integration of the thermal management structure 104 on the backside of the display module 102.

FIG. 3A illustrates a side, cross-sectional view of an example thermal management structure 104 of FIG. 1 along section A-A. FIG. 3A shows that the thermal management structure 104 can comprise a main body 300 that includes the cavity 204 containing the phase change material 206. The main body 300 can be any suitable shape, such as a cuboid, or any suitable polyhedron, such as a prism, a cylinder, or the like. The cuboid shape is ideal for the display module 102, which, for most electronic devices 100, includes multiple stacked rectangular (or cuboidal) layers/components.

The thermal management structure 104 can further comprise one or more retainers 302 that are disposed at a perimeter of the front external surface 130 and that protrude in a direction generally perpendicular to the front external surface 130 (i.e., in the positive z-direct on). The retainers 302 are configured to retain the remaining components of the backlight unit 118 (e.g., the reflector 128, the light guide 124, and/or the optical sheets 120) on the front external surface 130 and within a recess defined by the protruding retainers 302 and the front external surface 130.

The thermal management structure 104 can be made of any suitable heat conductive material, such as metals including, without limitation, sheet metal, copper, aluminum, titanium, or the like. In some configurations, the front external surface 130 of the thermal management structure 104 can be a polished metal to make the front external surface 130 light reflective. Alternatively, a reflective film 304 (or reflective coating 304, such as silver plating), as shown in FIG. 3A, can be disposed on the front external surface 130 of the thermal management structure 104 to provide light reflective qualities to the front external surface 130. In these configurations, the thermal management structure 104 can serve the additional purpose of a light reflector of the backlight unit 118, allowing for the omission of the reflector 128 from the display component stack, which, in turn, can allow for a further reduction in the thickness of the display module 102.

The thermal management structure 104 can further be any size, including any suitable thickness, t, where the thickness, t, is measured as a distance from the front external surface 130 to the rear external surface 200. In some configurations, the thickness, t, of the thermal management structure 104 can be 0.5 mm. In some configurations, the thickness, t, of the thermal management structure 104 can be within a range of about 0.2 mm to about 1 mm. In some configurations, the thickness, t, of the thermal management structure 104 can be at least about 0.2 mm, at least about 0.3 mm, at least about 0.4 mm, at least about 0.5 mm, at least about 0.6 mm, or at least about 0.7 mm. In some configurations, the thickness, t, of the thermal management structure 104 can be no greater than about 1 mm, no greater than about 0.9 mm, no greater than about 0.8 mm, no greater than about 0.7 mm, no greater than about 0.6 mm, no greater than about 0.5 mm, or no greater than about 0.4 mm.

In some configurations, a bottom portion of the main body 300 can be applied as a thin film (e.g., a thin copper film) having a thickness, b, on the order of about 0.05 mm (or 50 microns) thick. In some configurations, the thickness, b, of the bottom portion of the main body 300 can be within a range of about 0.05 mm to about 0.3 mm. In some configurations, the thickness, b, of the bottom portion of the main body 300 can be at least about 0.05 mm, at least about 0.1 mm, at least about 0.15 mm, at least about 0.2 mm, at least about 0.25 mm, or at least about 0.3 mm. In some configurations, the thickness, b, of the bottom portion of the main body 300 can be no greater than about 0.3 mm, no greater than about 0.25 mm, no greater than about 0.2 mm, no greater than about 0.15 mm, no greater than about 0.1 mm, or no greater than about 0.05 mm.

FIG. 3B illustrates a front, cross-sectional view of the example thermal management structure 104 shown in FIG. 3A as seen from section B-B. In FIG. 3B, the phase change material 206 has been omitted to better illustrate the cavity 204. FIG. 3B illustrates that the area of the cavity 204 (in a plane parallel to the frontal plane) is defined by a cavity length, multiplied by a cavity width, cw. FIG. 3B shows a configuration where the area of the cavity 204 is substantially equal to the area of the display layer 116 because it spans substantially the entire area of the viewable portion of the display (the difference in the respective areas being the area occupied by the side walls of the cavity 204. This configuration leverages the large area of the display as a heat spreader to effectively and efficiently dissipate heat generated by heat sources within (and external to) the electronic device 100. It is to be appreciated, however, that the size and shape of the cavity 204 depicted in FIGS. 3A and 3B is but one example configuration of the cavity 204, and the cavity 204 can be of different sizes and/or shapes. Furthermore, any suitable number of cavities 204 can be included in the thermal management structure 204, as described in more detail below.

FIG. 3C illustrates a front, cross-sectional view of the example thermal management structure 104 shown in FIG. 3A as seen from section B-B according to another configuration. Again, the phase change material 206 is not shown in FIG. 3C to illustrate the cavity 204. FIG. 3C depicts a cavity 204 having a columnar shape, the cavity 204 having a cavity length, cl, that substantially spans the thermal management structure 104 in a first dimension, such as along the x-axis. The cavity 204 is shown as being positioned in the middle of the thermal management structure 104, but the cavity 204 can be located anywhere along the y-axis to be closer to, or farther from, the top or bottom sides of the thermal management structure 104. The cavity width, cw, of the cavity 204 can be any suitable width. In some configurations, the cavity width, cw, (along the y-axis) of the cavity 204 in FIG. 3C can be no greater than about 25% of the total width of the thermal management structure 104 in the y-direction, no greater than about 20% of the total width of the thermal management structure 104 in the y-direction, no greater than about 15% of the total width of the thermal management structure 104 in the y-direction, no greater than about 10% of the total width of the thermal management structure 104 in the y-direction, or no greater than about 5% of the total width of the thermal management structure 104 in the y-direction.

Of course, the cavity 204 having a columnar shape, as shown in FIG. 3C, can span substantially the entire thermal management structure 104 in the orthogonal direction (in this case, the y-direction) instead of the x-direction. In this scenario, the longer dimension of the cavity 204 would run top-to-bottom in FIG. 3C rather than side-to-side. In some configurations, multiple cavities 204 having a columnar shape as shown in FIG. 3C can be defined in the thermal management structure 104 and arranged in a side-by-side arrangement such that multiple columnar cavities 204 are disposed along the y-axis or the x-axis in FIG. 3C, each cavity 204 containing a phase change material 206 therein. In some configurations, the phase change material 206 in each of the multiple cavities 204 that are arranged side-by-side in x-y directions can be different. For example, a first phase change material 206 that changes from a solid to a liquid at a particular temperature can be contained in a first columnar cavity 204, and a second columnar cavity 204 that is adjacent to the first columnar cavity 204 can contain a different phase change material 206 that changes from a liquid to a gas at the particular temperature, or at a different temperature, or that changes from a solid to a liquid at a different temperature. This can be done for any number of cavities 204 to have multiple cavities 204 with possibly different phase change materials 206 contained in each cavity 204.

FIG. 4A illustrates a side, cross-sectional view of an example thermal management structure 104 of FIG. 1 along section A-A. Again, the phase change material 206 is not shown in the cavity 204 in FIG. 4A for purposes of illustrating the cavity 204 and other features shown in FIG. 4A. FIG. 4A depicts a front internal surface 400 of the thermal management structure 104 and a rear internal surface 402 of the thermal management structure 104. FIGS. 4A and 4B further illustrate that one or more internal features 404 can be defined on, or can protrude from, either or both of the front internal surface 400 or the rear internal surface 402 that define part of the cavity 204 within the thermal management structure 104. The internal feature 404(1) shown in FIG. 4A spans the entire thickness of the cavity 204 in the z-direction and can be considered to be protruding from both the front internal surface 400 and the rear internal surface 402.

FIG. 4B illustrates a front, cross-sectional view of the example thermal management structure 104 shown in FIG. 4A as seen from section C-C. Again, the phase change material 206 is not shown in the cavity 204 of FIG. 4B for purposes of illustrating the cavity 204 and the internal features 404. Multiple internal features 404(1) and 404(2), and a gap 406 between them, can be seen from the front, cross-sectional view of FIG. 4B. The gap 406 allows a liquid or gaseous form of the phase change material 206 to flow freely between the left and right sides of the cavity 204 that are divided by the midsagittal plane. The internal features 404 can act as support structures that are configured to maintain the separation between the front internal surface 400 and the rear internal surface 402 of the thermal management structure 104 in response to the phase change material 206 changing phase to a liquid or a gas. This is particularly beneficial when a vacuum is created within the cavity 204 at the time of manufacturing, such as with a vapor chamber configuration where the phase change material 206 changes phase from a liquid to a gas at a temperature within a suitable temperature range, as described herein.

When the space within the cavity 204 is a vacuum and the phase change material 206 changes from a liquid to a gas, a force is created to urge the front internal surface 400 and the rear internal surface 402 of the thermal management structure 104 together (i.e., the cavity 204 is prone to collapsing). Thus, the internal feature(s) 404 prevent this collapse from occurring and keep the cavity 204 in an un-collapsed configuration, which allows the thermal management structure 104 to continue operating as a hyper-conductive system. Even when a vacuum is not created within the cavity 204, the internal feature(s) 404 can maintain the separation between the front internal surface 400 and the rear internal surface 402 during or after a phase change of the phase change material 206, regardless of whether the phase change material 206 goes from a solid to a liquid or from a liquid to a gas.

FIGS. 4A and 4B show the internal features 404(1) and 404(2) in the shape of rectangular protrusions that span a distance from the front internal surface 400 to the rear internal surface 402, and that protrude from bottom and top sides of the thermal management structure 104 in a direction that is generally perpendicular to the transverse plane. Furthermore, the internal features 404(1) and 404(2) are shown as being positioned in the middle of the cavity 204. It is to be appreciated, however, that the internal feature(s) 404 can be positioned at any suitable location within the cavity 204 and in any suitable orientation. For example, the internal features 404 can protrude from right and left sides of the thermal management structure 104 in a direction that is generally perpendicular to the midsagittal plane instead of the transverse plane. The cavity 204 can further include any number of internal features 404, such as multiple rectangular protrusions that extend from the top side of the thermal management structure 104, and multiple rectangular protrusions that extend from the bottom side of the thermal management structure 104 in a direction that is generally perpendicular to the transverse plane. Additionally, or alternatively, multiple internal features 404 can protrude from right and left sides of the thermal management structure 104 in a direction that is generally perpendicular to the midsagittal plane. Such configurations can create multiple channels within the cavity 204, and the phase change material 206 can flow, in liquid or gaseous form, through the channels.

The internal features 404 can be arranged in any suitable pattern, and individual internal features 404 can be of any suitable shape. Suitable patterns of the internal features 404 can include, without limitation, a mesh pattern, honeycomb pattern, a lattice pattern, a spiral pattern, and the like.

In some configurations, the internal features 404 can be defined on the front internal surface 400 and/or the rear internal surface 402. For example, the front internal surface 400 and/or the rear internal surface 402 (or at least portions thereof) can have a surface texture (e.g., a rough surface) that promotes a capillary response for a vapor chamber configuration of the thermal management structure 104. Such a surface texture can be considered an "internal feature 404," as the term is used herein. For example, when the phase change material 206 comprises a working fluid that is configured to change from a liquid to a gas at a temperature within a suitable temperature range, as described herein, a surface texture (i.e., an internal feature 404) on the front and/or rear internal surface 400/402 can promote the capillary response for transporting liquid within the cavity 204, which, in turn, enables the internal cooling cycle for the hyper-conductive system to continue.

FIG. 5 illustrates a side, cross-sectional view of an example thermal management structure 104 of FIG. 1 along section A-A. FIG. 5 shows that the thermal management structure 104 can include a first cavity 204(1) and a second cavity 204(2) separated by a dividing wall 500 that segregates the first cavity 204(1) from the second cavity 204(2). The first cavity 204(1) contains a first phase change material 206(1) and the second cavity 204(2) contains a second phase change material 206(2). The phase change materials 2060) and 206(2) can be the same materials or different materials. In configurations where the first phase change material 206(1) is different from the second phase change material 206(2), a "hybrid" thermal management structure 104 can be created. In the hybrid configuration, the first phase change material 206(1) can change phase at a different temperature than the temperature at which the second phase change material 206(2) changes phase, and/or the first phase change material 206(1) can change from a solid to a liquid during the phase change at the same or different temperature at which the second phase change material 206(2) changes from a liquid to a gas, or vice versa. For example, the first phase change material 206(1) can comprise wax, and the second phase change material 206(2) can comprise water, or vice versa. The hybrid implementation of FIG. 5 can be implemented in the electronic device 100 so that the liquid-to-gas phase change material 206(2) spreads heat in the frontal plane (i.e., x-y directions) acting as a hyper-conductive heat management solution configured to help counteract temperature rise during sustained usage of the electronic device 100 at a high workload, and the solid-to-liquid phase change material 206(1) stores heat by melting in the z-direction acting as a "thermal battery" heat management solution configured to counter temperature spikes at peak workloads of the electronic device 100.

It is to be appreciated that, although two cavities 204 are shown in FIG. 5 for the hybrid configuration, any number of cavities 204 can be included in the thermal management structure 104, such as a plurality of columnar cavity 204 pairings like the pairing of cavities 204(1) and 204(2) shown in FIG. 5. Each cavity 204 in the plurality of columnar cavity 204 pairings can be similar in shape to the columnar shaped cavity 204 shown in FIG. 3C, and arranged side-by-side along the x-axis or the y-axis. In this configuration, a first phase change material 206(1) in a first cavity 204(1) of a cavity 204 pairing can be different from a second phase change material 206(2) in a second cavity 204(2) of a cavity 204 pairing that is adjacent to the first cavity 204(1), spaced from the first cavity 204(1) in the z-direct on, and separated by a dividing wall 500. In this configuration, different phase change materials 206 can be used in a plurality of cavities 204 in any suitable configuration. Again, the cavities 204 can be of any suitable shape, such as an array of cylindrical cavities 204, prismatic cavities, or any suitable polyhedron.

Figure 6:
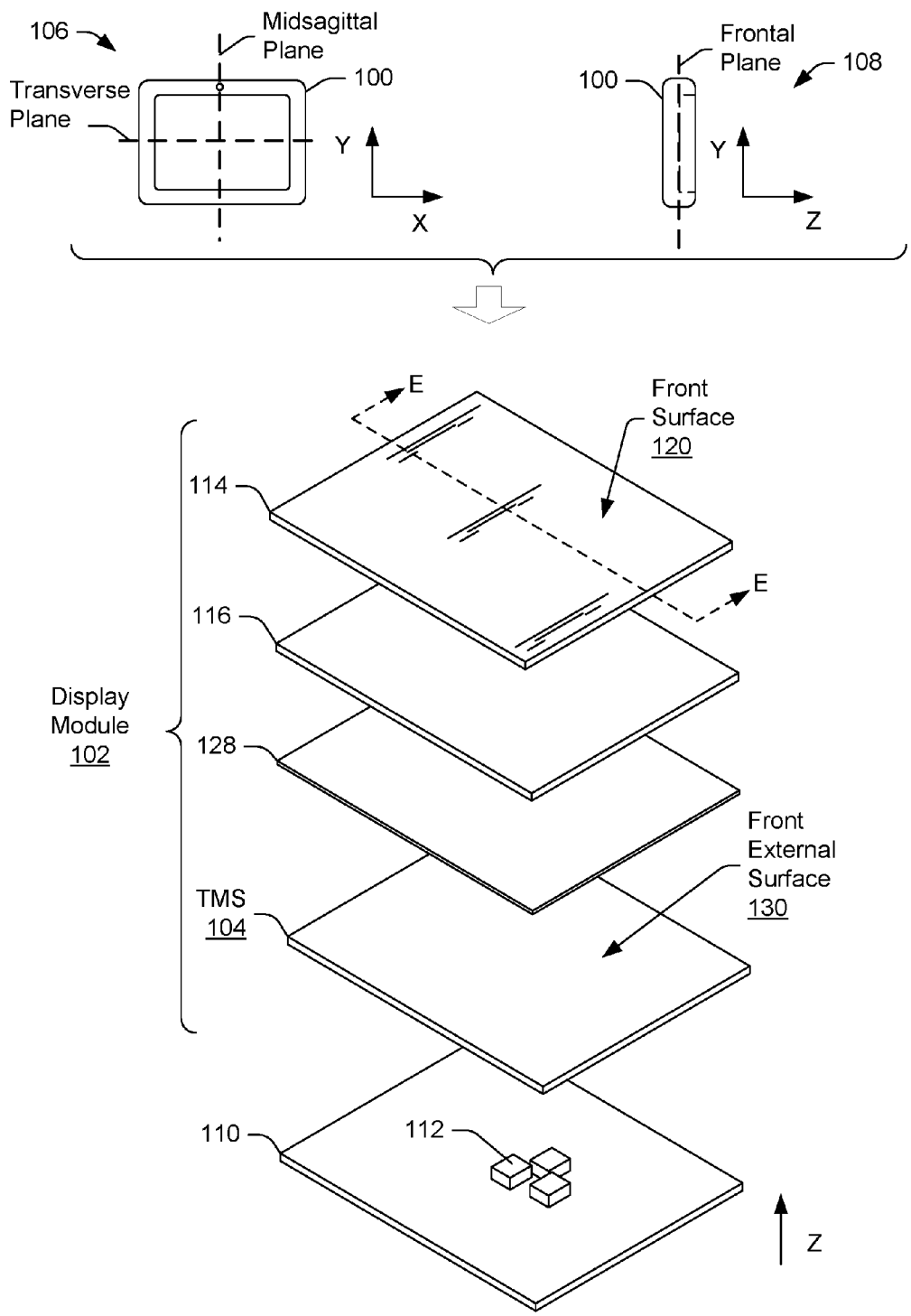
FIG. 6 illustrates an exploded perspective view of example components of another example electronic device including a display module having a thermal management structure integrated on a backside of the display module.

FIG. 6 illustrates an exploded perspective view of example components of another example electronic device 100 including a display module 102 having a thermal management structure 104 integrated on a backside of the display module 102. Notably, the difference between FIG. 6 and FIG. 1 is that the display module 102 does not include a backlight unit 118. In this manner, the thermal management structure 104 is shown as being integrated with a display technology that does not include a backlight, such as an OLED display, or an electrophoretic display, in some instances. In the configuration of FIG. 6, for example, the display layer 116 can still be disposed behind the cover lens 114, but the display layer 116 can comprise a layer of OLED elements. An OLED display utilizes a current passed through thin-film layers of organic materials to generate light. Thus, the display layer 116 can comprise a layer of OLED elements, wherein each OLED element emits red, green, or blue. As noted above, the display layer 116 can generally be configured to activate individual pixels in terms of either emitting light or allowing light to pass through the pixel area, and to generate a pixel color (e.g., red, green, or blue). The display layer 116 in an OLED configuration can further include a polymer on which OLED compounds are deposited in rows and columns to create the layer of OLED elements. The resulting matrix of OLED elements can emit light such that no backlight unit 118 is necessary in the configuration of FIG. 6.

A reflector 128 can be disposed behind the display layer 116 (e.g., a layer of OLED elements) to reflect any light emitted by the display layer 116 (e.g., light emitted by the OLED elements) in the negative z-direction so that the light is directed in the positive z-direction, toward a viewing user.

The thermal management structure 104 can be disposed behind the reflector 128. Alternatively, in configurations where the front external surface 130 of the thermal management structure 104 is light reflective, the reflector 128 can be omitted from the display component stack of the display module 102 to recover at least some of the added thickness of the thermal management structure 104, and to maintain a relatively thin device profile. Notably, the shape and the structural configuration of the thermal management structure 104 shown in FIG. 6 is different from that of the thermal management structure 104 shown in the previous figures. Namely, the thermal management structure 104 shown in FIG. 6 does not include the retainers 302 shown in FIG. 3A, for example. Rather, the thermal management structure 104 of FIG. 6 can include a main body that is similar in shape and structure to the main body 300 of the thermal management structure 104 shown in FIG. 3A. There is no longer a need for the retainers 302 in the configuration of FIG. 6 (e.g., an OLED display) because there is no backlight unit 118 in the display component stack of FIG. 6. In other respects, the thermal management structure 104 can have any of the features or characteristics described herein with reference to the thermal management structure 104 that is described as being utilized with display technologies that include the backlight unit 118 (e.g., LCD displays).

The electronic device 100 of FIG. 6 can include the logic board 110 having one or more heat generating components 112 (e.g., a CPU) mounted thereon, and the heat generating component(s) 112 can be coupled to a rear external surface 200 of the thermal management structure 104. The coupling of the heat generating component(s) 112 to the rear external surface 200 of the thermal management structure 104 can be accomplished by the use of a thermal interface material 202 described herein.

Figure 7:
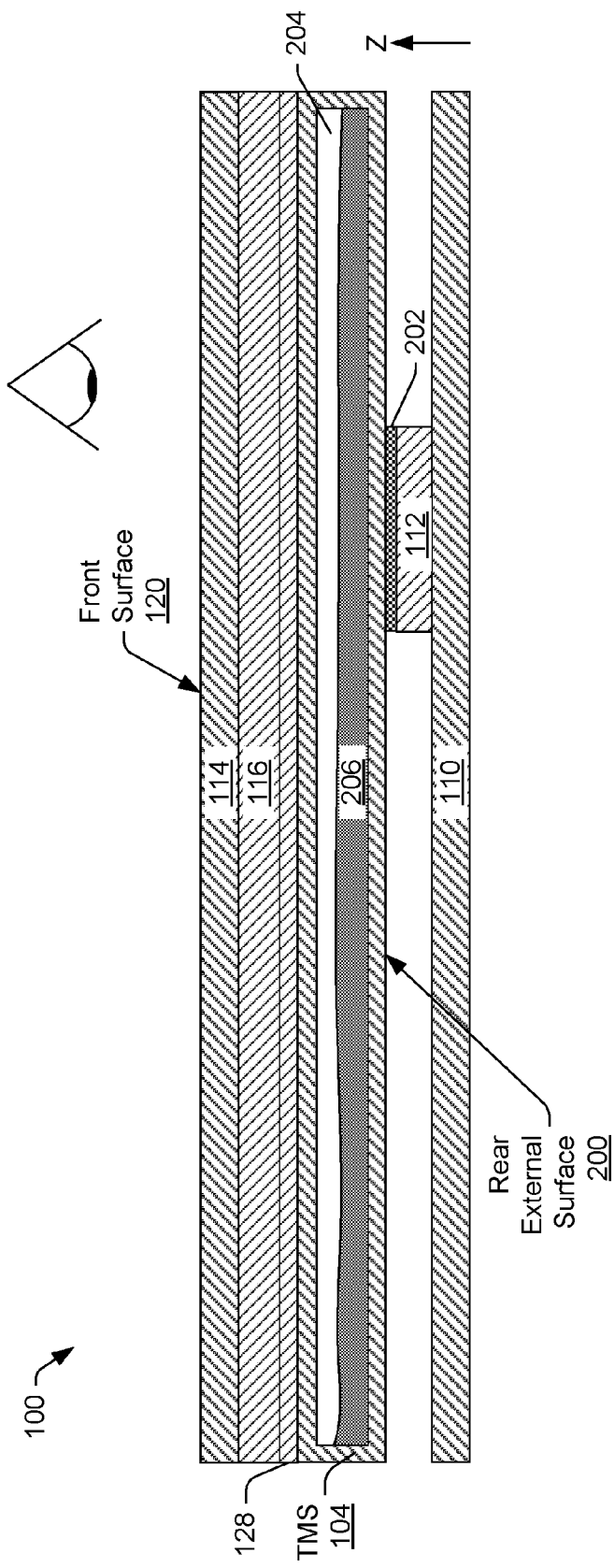
FIG. 7 illustrates a side, cross-sectional view of the example electronic device of FIG. 6 along section E-E.

FIG. 7 illustrates a side, cross-sectional view of the example electronic device 100 of FIG. 6 along section E-E FIG. 7 is similar to FIG. 2 in that the components are shown coupled together as they would be after assembly, but the configuration of FIG. 7 applies to display technologies that do not include a backlight unit 118, and hence, the electronic device 100 shown in FIG. 7 does not include a backlight unit 118. Accordingly, the electronic device 100 shown in FIG. 7 can represent an electronic device 100 having an OLED display, and the thermal management structure 104 is shown as being integrated on a backside of the display module 102 by virtue of the thermal management structure 104 being a rear-most component of the display module 102. The front external surface 130 of the thermal management structure 104 is shown as being in contact with the reflector 128. However, in configurations where the reflector 128 is omitted, the front external surface 130 of the thermal management structure 104 can be in contact with the display layer 116 (e.g., the layer of OLED elements). For example, the front external surface 130 can be configured to reflect light, as described herein, allowing for the omission of the reflector 128 and a further reduction of thickness of the electronic device 100. Furthermore, the thermal management structure 104 shown in FIG. 7 does not include retainers 302. Instead, the thermal management structure 104 is coupled to a layer in front of it (e.g., the reflector 128, the display layer 116, etc.) on a substantially uniform flat front external surface 130.

Figure 8:
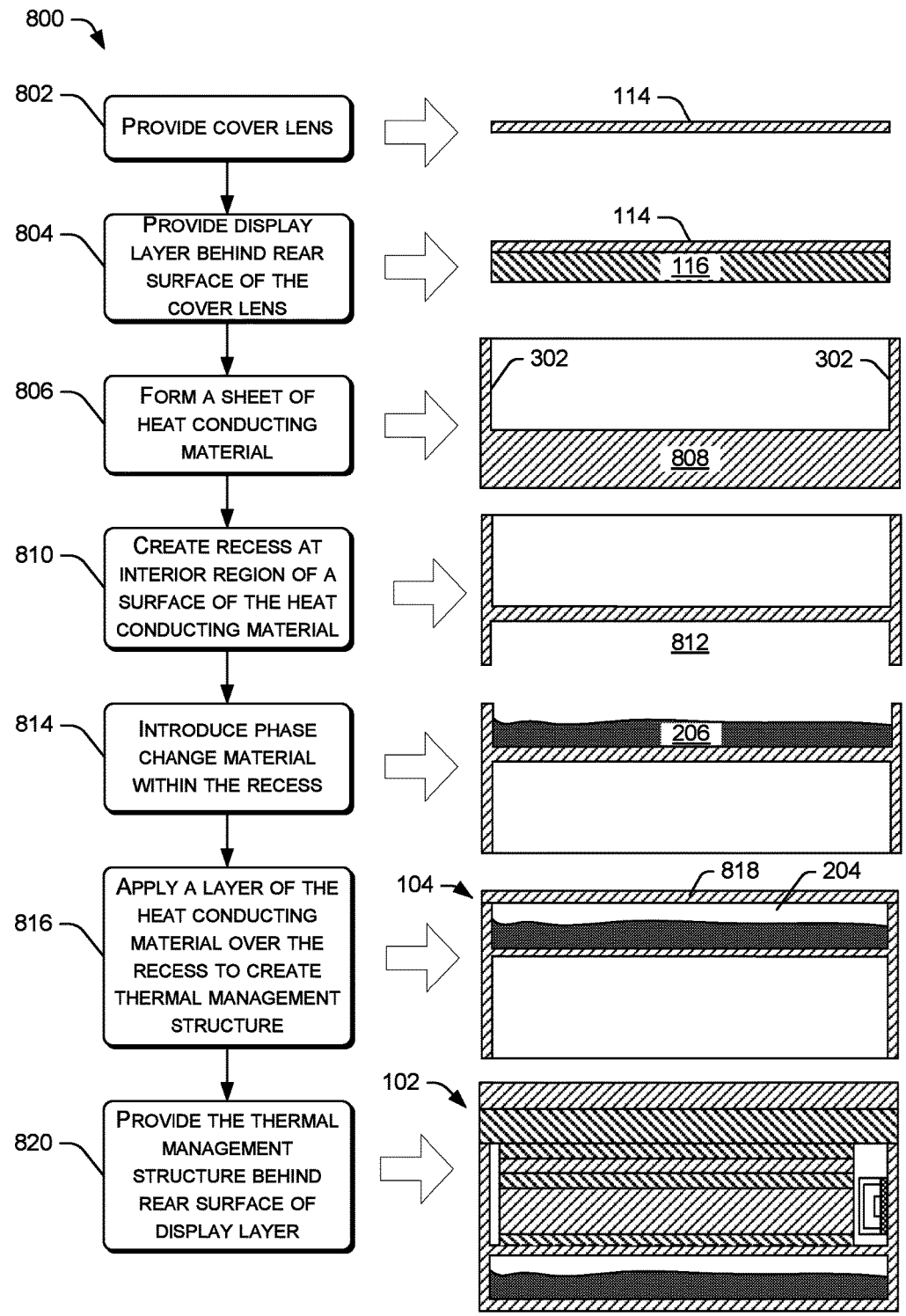
FIG. 8 is a flow diagram of an illustrative process of manufacturing at least part of a display module for use in an electronic device.

FIG. 8 is a flow diagram of an illustrative process 800 of manufacturing at least part of a display module 102 for use in an electronic device 100. The process 800 can be implemented in order to manufacture, fabricate, or produce any of the embodiments of the display module 102 described herein and illustrated in the previous figures. This process 800 is illustrated as a collection of blocks in a logical flow graph. The order in which the operations are described is not intended to be construed as a limitation, and any number of the described blocks can be combined in any order or in parallel to implement the process 800.

At 802, a cover lens 114 can be provided. For example, a stock material suitable for the cover lens 114, as described herein, can be obtained and cut to a size suitable for the display module 102 that is to be manufactured.

At 804, a display layer 116 can be provided behind a rear surface of the cover lens 114. The display layer 116 can be of any suitable type of display technology, such as an LCD panel, a layer of OLED elements, an electrophoretic layer, or the like. The display layer 116 can be bonded to the rear surface of the cover lens 114 using an OCA, as described herein. In some configurations, a touch layer (e.g., a capacitive touch sensor) can be disposed between the cover lens 114 and the display layer 116 and the multiple layers can be bonded together.

At 806, a sheet of heat conducting material 808 (e.g., metal) can be formed. FIG. 8 shows that the sheet of heat conducting material 808 can be formed with one or more retainers 302 disposed at a perimeter of the sheet 808, the retainers 302 protruding from a surface of the sheet 808. The retainers 302 can be formed in instances where the display module 102 is to include a backlight unit 118. However, it is appreciated that, in some configurations, the retainers 302 can be omitted from the sheet 808 that is formed at 806, such as with a display module 102 that is not to include a backlight unit 118. Any suitable process (e.g., extrusion, die casting, etc., can be used to form the sheet of heat conducting material 808 at 806.

At 810, a recess 812 can be created at an interior region of a surface of the sheet of heat conducting material 808. The recess 812 can be created at 810 using any suitable technique, such as etching, star ping, machining, or the like. In some configurations, one or more internal features 404 can be created within the recess 812. For example, any suitable technique to create a rough surface texture on the surfaces that define the recess 812 can be performed to create an internal feature 404 comprising a rough surface texture. As another example, one or more internal features 404 can be formed by a subtractive manufacturing process during the creation of the recess at 810, such as etching, stamping, machining. Alternatively, an additive manufacturing process can be utilized after creation of the recess at 810, such as three dimensional (3D) printing, direct metal laser sintering (MILS), or the like, to create one or more internal features 404 within the recess 812.

At 814, a phase change material 206 can be introduced within the recess 812. Any suitable phase change material 206 described herein can be introduced within the recess 812. For example, the recess 812 can be filled, at least partially, with water (e.g., deionized water).

At 816, a layer 818 of the heat conducting material (e.g., metal) can be applied over a top of the recess 812 to enclose the recess 812 and to create a thermal management structure 104 having a cavity 204 that contains the phase change material 206. The layer 818 applied at 816 can be applied by diffusion bonding the sheet 808 and the layer 818 together at the coupling points, attaching (e.g., welding) at the coupling points, 3D printing the layer 818 over the recess 812, electroplating the layer 818 onto the sheet 808 over the recess 812, or any other suitable additive manufacturing technique.

At 820, the thermal management structure 104 created after 816 can be provided behind a rear surface of the display layer 116 to create the display module 102. In some configurations, the thermal management structure 104 is part of a backlight unit 108. In this configuration, the backlight unit 118 can be assembled with the thermal management structure 104 acting as a frame to hold remaining components of the backlight unit 118 (e.g., a light guide 124, the optical sheets 122, etc.), and the backlight unit 118 can be coupled to the rear surface of the display layer 116 (e.g., an LCD panel). In other configurations, the thermal management structure 104 can be coupled directly to the rear surface of the display layer 116 (e.g., a layer of OLED elements), or to a reflector 128 in configurations that include an additional reflector 128.

Figure 9:
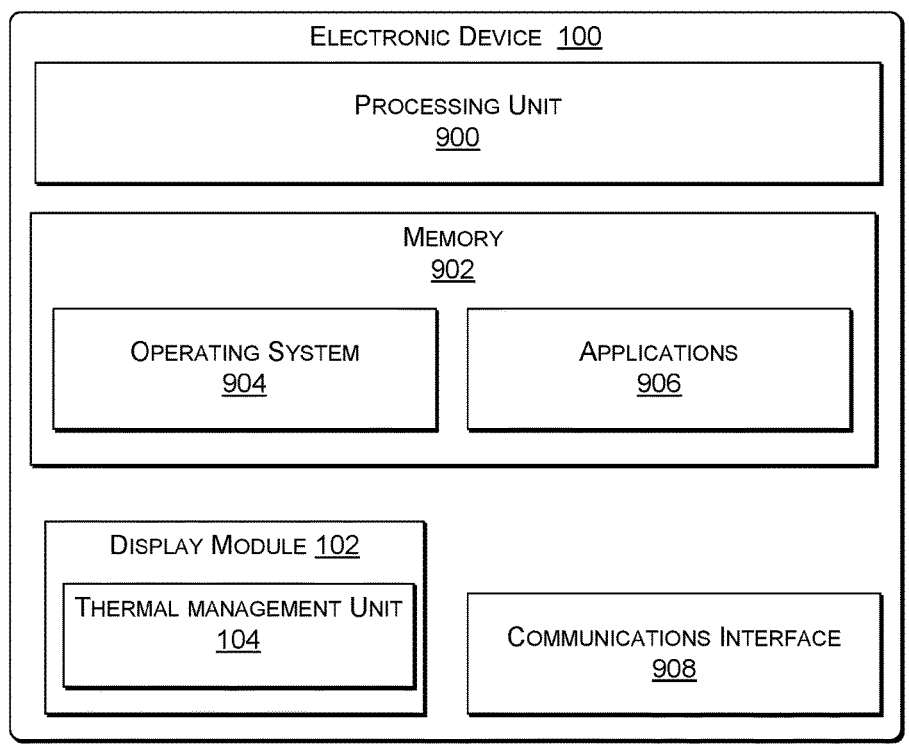
FIG. 9 is a block diagram showing high-level components of an example electronic device that may be used in conjunction with the systems and techniques described herein.

FIG. 9 is a block diagram showing high-level components of an example electronic device 100 that may be used in conjunction with the systems and techniques described herein. The electronic device 100 is shown as being equipped with one or more processors 900 and one or more forms of computer-readable memory 902. The processor(s) 900 can be configured to execute instructions, applications, or programs stored in the memory 902. In some configurations, the processor(s) 900 can include hardware processors that include, without limitation, CPU, a (FPGA), a CPLD, an ASIC, a SoC, or a combination thereof. The processing unit 900 can be mounted on the logic board 110.

Computer-readable media can include two types of computer-readable media, namely computer storage media and communication media. The memory 902 is an example of computer storage media. Computer storage media can include volatile and non-volatile, removable, and non-removable media implemented in any method or technology for storage of information, such as computer readable instructions, data structures, program modules, or other data. Computer storage media includes, but is not limited to, random access memory (RAM), read-only memory (ROM), erasable programmable read-only memory (EEPROM), flash memory or other memory technology, compact disc read-only memory (CD-ROM), DVD, or other optical storage, magnetic cassettes, magnetic tape, magnetic disk storage or other magnetic storage devices, or any other non-transmission medium that can be used to store the desired information and that can be accessed by the processor(s) 900. Any such computer storage media can be part of the electronic device 100. The memory 902 can store an operating system 904 and various applications 906, which can include components, modules, and/or logic for particular actions.

In contrast, communication media embody computer-readable instructions, data structures, program modules, or other data in a modulated data signal, such as a carrier wave, or other transmission mechanism. As defined herein, computer-storage media does not include communication media.

The electronic device 100 can include the display module 102, as described herein, for providing output (and in some configurations, receiving input as a touch screen). The display module 102 can include the thermal management unit 104, as described herein. The thermal management unit 104 can be integrated on a backside of the display module 102. The electronic device 100 can further include a communications interface 908, such as a network interface for communicating with external devices.

Example One

An electronic device comprising: a display module comprising: a cover lens; a display layer disposed behind the cover lens; and a thermal management structure integrated on a backside of the display module behind the display layer, the thermal management structure comprising a cavity containing a material configured to change phase during operation of the electronic device; and a heat generating component disposed behind the display module and coupled to a rear external surface of the thermal management structure.

Example Two

The electronic device of Example One, wherein a front external surface of the thermal management structure is configured to reflect light.

Example Three

The electronic device of any of the previous examples, alone or in combination, wherein a material of the front external surface of the thermal management structure comprises at least one of polished metal, a light-reflecting film, or a light-reflecting coating.

Example Four

The electronic device of any of the previous examples, alone or in combination, wherein the front external surface of the thermal management structure is in contact with at least one of a light guide of a backlight unit or the display layer.

Example Five

The electronic device of any of the previous examples, alone or in combination, wherein: the display layer comprises a liquid crystal display (LCD) panel; the thermal management structure is part of a backlight unit that is disposed behind the LCD panel; a front external surface of the thermal management structure is in contact with a reflector or a light guide plate of the backlight unit; and the thermal management structure comprises one or more retainers disposed at a perimeter of the front external surface, the one or more retainers protruding in a direction generally perpendicular to the front external surface.

Example Six

The electronic device of any of the previous examples, alone or in combination, wherein: the display layer comprises a layer of organic light emitting diode (OLED) elements; and a front external surface of the thermal management structure is in contact with the layer of OLED elements or a reflector disposed between the layer of OLED elements and the front external surface of the thermal management structure.

Example Seven

The electronic device of any of the previous examples, alone or in combination, wherein: a rear surface of the display layer has a first area in a first plane that is parallel to a frontal plane of the electronic device; and the rear external surface of the thermal management structure spans a second area in a second plane that is parallel to the frontal plane, the second area being substantially equal to the first area.

Example Eight

The electronic device of any of the previous examples, alone or in combination, wherein: a rear surface of the display layer has a first area in a first plane that is parallel to a frontal plane of the electronic device; and the cavity is defined by a volume within the thermal management structure, the volume having a second area in a second plane that is parallel to the frontal plane, the second area being substantially equal to the first area.

Example Nine

The electronic device of any of the previous examples, alone or in combination, wherein: the cavity is defined, at least in part, by a front internal surface of the thermal management structure and a rear internal surface of the thermal management structure; the front internal surface or the rear internal surface includes one or more internal features; and the internal features are configured to maintain a separation between the front internal surface and the rear internal surface in response to the material within the cavity changing phase.

Example Ten

The electronic device of any of the previous examples, alone or in combination, wherein: the thermal management structure includes multiple cavities, the cavity being a first cavity of the multiple cavities; and the material is a first material within the first cavity that is configured to change phase from a solid to a liquid at a temperature within a temperature range of about 30 degrees Celsius (° C.) to about 110° C., the thermal management structure further comprising: a second cavity of the multiple cavities that contains a second material configured to change phase from a liquid to a gas at the temperature, or a different temperature, within the temperature range.

Example Eleven

An electronic device comprising: a display module having a backlight unit, at least part of the backlight unit comprising a thermal management structure, the thermal management structure comprising a cavity containing a material configured to change phase within a temperature range of about 30 degrees Celsius (° C.) to about 110° C.; and a heat generating component disposed on a logic board behind the display module.

Example Twelve

The electronic device of Example Eleven, wherein the heat generating component is coupled to a rear external surface of the thermal management structure using a thermal interface material.

Example Thirteen

The electronic device of any of the previous examples, alone or in combination, wherein the material within the cavity comprises a working fluid that is configured to change phase from a liquid to a gas at a temperature within the temperature range.

Example Fourteen

The electronic device of any of the previous examples, alone or in combination, wherein the material within the cavity is configured to change phase from a solid to a liquid at a temperature within the temperature range.

Example Fifteen

The electronic device of any of the previous examples, alone or in combination, wherein the material within the cavity is wax.

Example Sixteen

The electronic device of any of the previous examples, alone or in combination, wherein: the thermal management structure spans an area in a plane that is parallel to a frontal plane of the electronic device, the area being defined by a first dimension of the plane multiplied by a second dimension of the plane; and the cavity is of a columnar shape having: a length that substantially spans the thermal management structure in the first dimension; and a width that is no greater than about 25% of the thermal management structure in the second dimension.

Example Seventeen

An electronic device comprising: means for generating an image via a display screen of the electronic device, the means for generating the image comprising: means for protecting internal components of the electronic device; means for activating individual pixels, the means for activating the individual pixels being disposed behind the means for protecting the internal components; and means for dissipating heat integrated on a backside of the means for generating the image and behind the means for activating the individual pixels, the means for dissipating the heat comprising means for containing a material configured to change phase during operation of the electronic device; and means for generating the heat disposed behind the means for generating the image and coupled to a rear external surface of the means for dissipating the heat.

Example Eighteen

The electronic device of Example Seventeen, wherein the means for dissipating the heat is part of a means for projecting light in a direction towards the means for activating the individual pixels.

Example Nineteen

The electronic device of any of the previous examples, alone or in combination, wherein: the means for containing the material is defied, at least in part, by a front internal surface of the means for dissipating the heat and a rear internal surface of the means for dissipating the heat; and the front internal surface or the rear internal surface includes one or more means for maintaining a separation between the front internal surface and the rear internal surface in response to the material changing phase.

Example Twenty

An electronic device comprising: means for generating an image via a display screen of the electronic device, the means for generating the image having a means for projecting light in a direction towards a viewing user of the electronic device; at least part of the means for projecting the light comprising means for dissipating heat, the means for dissipating the heat comprising means for containing a material configured to change phase within a temperature range of about 30 degrees Celsius (° C.) to about 110° C.; and means for generating heat disposed on a logic board behind the means for generating the image.

Example Twenty One

A method of manufacturing a display module for use in an electronic device, the method comprising: providing a cover lens; providing a display layer behind a rear surface of the cover lens; forming a sheet of heat conducting material; creating a recess at an interior region of a surface of the sheet of heat conducting material; introducing, within the recess, a material configured to change phase within a temperature range of about 30 degrees Celsius (° C.) to about 110° C.; applying a layer of the heat conducting material over the recess to enclose the recess and to create thermal management structure having a cavity that contains the material; and providing the thermal management structure behind a rear surface of the display layer.

Example Twenty Two

The method of Example Twenty One, wherein forming the sheet of heat conducting material comprises forming the sheet having one or more retainers disposed at a perimeter of the sheet, the one or more retainers protruding in a direction generally perpendicular to a surface of the sheet.

Example Twenty Three

The method of any of the previous examples, alone or in combination, further comprising: assembling a backlight unit by providing, within a recess of the thermal management structure created by the one or more retainers, one or more light sources, a light guide, and one or more optical sheets, wherein providing the thermal management structure behind the rear surface of the display layer comprises coupling the backlight unit to the rear surface of the display layer.

Example Twenty Four

The method of any of the previous examples, alone or in combination, wherein providing the thermal management structure behind the rear surface of the display layer comprises coupling a front external surface of the thermal management structure to the rear surface of the display layer or to a reflector disposed between the thermal management structure and the display layer.

CONCLUSION

In closing, although the various configurations have been described in language specific to structural features and/or methodological acts, it is to be understood that the subject matter defined in the appended representations is not necessarily limited to the specific features or acts described. Rather, the specific features and acts are disclosed as example forms of implementing the claimed subject matter.

What is claimed is:
1. An electronic device comprising:
a display module comprising:
a cover lens;
a display layer disposed behind the cover lens;
a backlight unit comprising a light guide; and
a thermal management structure integrated on a backside of the display module behind the display layer, the thermal management structure comprising:
a cavity containing a material configured to change phase during operation of the electronic device; and
one or more retainers disposed at a perimeter of a front external surface of the thermal management structure, the one or more retainers protruding in a direction away from the front external surface of the thermal management structure, wherein the front external surface of the thermal management structure and the one or more retainers define a recess in which the light guide of the backlight unit is disposed; and
a heat generating component disposed, behind the display module and coupled to a rear external surface of the thermal management structure and the display module.
2. The electronic device of claim 1, wherein the front external surface of the thermal management structure is configured to reflect light.
3. The electronic device of claim 2, wherein a material of the front external surface of the thermal management structure comprises at least one of polished metal, a light-reflecting film, or a light-reflecting coating.
4. The electronic device of claim 1, wherein the front external surface of the thermal management structure is in contact with the light guide of the backlight unit.
5. The electronic device of claim 1, wherein:
the display layer comprises a liquid crystal display (LCD) panel;
the thermal management structure is part of the backlight unit, which is disposed behind the LCD panel;

the front external surface of the thermal management structure is in contact with a reflector or a light guide plate of the light guide of the backlight unit; and the one or more retainers protrude in a direction generally perpendicular to the front external surface.

6. The electronic device of claim 1, wherein:

a rear surface of the display layer has a first area in a first plane that is parallel to a frontal plane of the electronic device; and the rear external surface of the thermal management structure spans a second area in a second plane that is parallel to the frontal plane, the second area being substantially equal to the first area.

7. The electronic device of claim 1, wherein:

a rear surface of the display layer has a first area in a first plane that is parallel to a frontal plane of the electronic device; and the cavity is defined by a volume within the thermal management structure, the volume having a second area in a second plane that is parallel to the frontal plane, the second area being substantially equal to the first area.

8. The electronic device of claim 1, wherein:

the thermal management structure includes multiple cavities, the cavity being a first cavity of the multiple cavities; and the material is a first material within the first cavity that is configured to change phase from a solid to a liquid at a temperature within a temperature range of about 30 degrees Celsius (° C.) to about 110° C., the thermal management structure further comprising:

a second cavity of the multiple cavities that contains a second material configured to change phase from a liquid to a gas at the temperature, or a different temperature, within the temperature range.

9. The electronic device of claim 1, wherein an outer surface of the heat generating component is attached to the rear external surface of the thermal management structure and the display module.

10. The electronic device of claim 9, wherein the outer surface of the heat generating component is attached to the rear external surface of the thermal management structure and the display module via a thermal interface material.

11. The electronic device of claim 1, wherein the one or more retainers of the thermal management structure are in contact with the display layer.

12. An electronic device comprising:

a display module having a backlight unit, the backlight unit comprising a light guide, at least part of the backlight unit comprising a thermal management structure, the thermal management structure comprising a cavity containing a material configured to change phase within a temperature range of about 30 degrees Celsius (° C.) to about 110° C.; and a heat generating component disposed on a logic board behind the display module, the heat generating component being attached to a rear external surface of the thermal management structure of the display module, wherein the thermal management structure further comprises one or more retainers disposed at a perimeter of a front external surface of the thermal management structure, the one or more retainers protruding in a direction away from the front external surface of the thermal management structure, wherein the front external surface of the thermal management structure and the one or more retainers define a recess in which the light guide of the backlight unit is disposed.

13. The electronic device of claim 12, wherein the heat generating component is coupled to a rear external surface of the thermal management structure using a thermal interface material.

14. The electronic device of claim 12, wherein the material within the cavity comprises a working fluid that is configured to change phase from a liquid to a gas at a temperature within the temperature range.

15. The electronic device of claim 12, wherein the material within the cavity is configured to change phase from a solid to a liquid at a temperature within the temperature range.

16. The electronic device of claim 15, wherein the material within the cavity is wax.

17. The electronic device of claim 12, wherein:

the thermal management structure spans an area in a plane that is parallel to a frontal plane of the electronic device, the area being defined by a first dimension of the plane multiplied by a second dimension of the plane; and the cavity is of a columnar shape having:

a length that substantially spans the thermal management structure in the first dimension; and a width that is no greater than about 25% of the thermal management structure in the second dimension.

18. A method of manufacturing a display module for use in an electronic device, the method comprising:

providing a cover lens;

providing a display layer behind a rear surface of the cover lens;

forming a sheet of heat conducting material, wherein forming the sheet of heat conducting material comprises forming the sheet having one or more retainers, the one or more retainers protruding in a direction away from a surface of the sheet;

creating a first recess at an interior region of a surface of the sheet of heat conducting material;

introducing, within the first recess, a material configured to change phase within a temperature range of about 30 degrees Celsius (° C.) to about 110° C.;

applying a layer of the heat conducting material over the first recess to enclose the first recess and to create a thermal management structure having a cavity that contains the material;

providing a backlight unit within a second recess of the thermal management structure, such that a light guide of the backlight unit is disposed within the second recess, the second recess of the thermal management structure being formed by the one or more retainers; and providing the thermal management structure behind a rear surface of the display layer.

19. The method of claim 18, wherein the one or more retainers are disposed at a perimeter of the sheet, the one or more retainers protruding in a direction generally perpendicular to the surface of the sheet.

20. The method of claim 19, wherein providing the backlight unit within the second recess of the thermal management structure comprises assembling the backlight unit within the second recess of the thermal management structure formed by the one or more retainers, the assembling comprising providing one or more light sources, the light guide, and one or more optical sheets within the second recess of the thermal management structure formed by the one or more retainers, and wherein providing the thermal management structure behind the rear surface of the display layer comprises coupling the backlight unit to the rear surface of the display layer.

* * * * *